United States Patent [19]
Maeda

[11] Patent Number: 5,943,559
[45] Date of Patent: Aug. 24, 1999

[54] METHOD FOR MANUFACTURING LIQUID CRYSTAL DISPLAY APPARATUS WITH DRAIN/SOURCE SILICIDE ELECTRODES MADE BY SPUTTERING PROCESS

[75] Inventor: Akitoshi Maeda, Tokyo, Japan

[73] Assignee: NEC Corporation, Tokyo, Japan

[21] Appl. No.: 08/880,505

[22] Filed: Jun. 23, 1997

[51] Int. Cl.6 .................................................. H01L 21/00
[52] U.S. Cl. .......................... 438/149; 438/151; 438/158; 438/159
[58] Field of Search ............................. 438/30, 149, 151, 438/158, 159, FOR 200

[56] References Cited

U.S. PATENT DOCUMENTS

| | | | |
|---|---|---|---|
| 5,028,551 | 7/1991 | Dohjo et al. | 438/30 |
| 5,334,544 | 8/1994 | Matsuoka et al. | 438/158 |
| 5,427,962 | 6/1995 | Sasaki et al. | 438/159 |
| 5,821,622 | 10/1998 | Tsuji et al. | 257/763 |

FOREIGN PATENT DOCUMENTS

| | | |
|---|---|---|
| 61-248564 | 11/1986 | Japan . |
| 62-172761 | 7/1987 | Japan . |
| 2-206131 | 8/1990 | Japan . |
| 5235034 | 9/1993 | Japan . |

Primary Examiner—John F. Niebling
Assistant Examiner—Christopher Lattin
Attorney, Agent, or Firm—Sughrue, Mion, Zinn, Macpeak & Seas, PLLC

[57] ABSTRACT

In a method for manufacturing a liquid crystal display apparatus, a gate electrode is formed on an insulating substrate, and a gate insulating layer is formed on the gate electrode. Then, a semiconductor active layer is formed on the gate insulating layer. Then, a metal silicide layer is formed on the semiconductor active layer by using a sputtering process, and a metal layer is formed on the metal silicide layer. Then, the metal layer is etched by a dry etching process using a mask, an the metal silicide layer is etched by a wet etching process using the same mask. Finally, the semiconductor active layer is etched by using the metal layer as a mask.

14 Claims, 22 Drawing Sheets

METHOD FOR MANUFACTURING LIQUID CRYSTAL DISPLAY APPARATUS WITH DRAIN/SOURCE SILICIDE ELECTRODES MADE BY SPUTTERING PROCESS

BACKGROUND OF THE INVENTION

1. Field of the Invention

The present invention relates to a method for manufacturing a liquid crystal display (LCD) apparatus, and more particularly, a method for manufacturing the drain/source electrodes of a thin film transistor (TFT).

2. Description of the Related Art

Active matrix-type LCD apparatuses are so thin and light that they are often used in various display apparatuses. Also, since the active matrix-type LCD apparatuses can be of a large size and fine screen with a high quality and a low power dissipation, cathode ray tubes (CRTs) have been replaced with the active matrix-type LCD apparatuses.

In an active matrix-type LCD apparatus, one TFT is provided as a switching element for each pixel. The TFT is constructed by a gate electrode, a semiconductor active layer made of amorphous silicon opposing the gate electrode, a drain electrode, and a source electrode connected to a transparent pixel electrode.

In a prior art method for manufacturing an LCD apparatus, a gate electrode is formed, on an insulating substrate, and a gate insulating layer is formed on the gate electrode. Then, a semiconductor active layer made of amorphous silicon is formed on the gate insulating layer. Then, a metal layer is formed on the semiconductor active layer. Thereafter, in order to obtain good ohmic contact between the metal layer and the semiconductor active layer a metal silicide layer is formed by reacting the metal layer with the semiconductor active layer by using a ramp annealing operation or the like at about 250 to 300° C. Then, the metal layer is etched by a dry etching process to form drain/source electrodes. Finally, the semiconductor active layer is etched by a dry etching process using the drain/source electrodes as a mask. This will be explained later in detail.

In the above-mentioned prior art method, however, since the metal silicide layer is too thin (about 5 to 10 nm), the overetching of the metal layer invites etching of the semiconductor active layer. Note that the etched amount of the semiconductor active layer is not reproducible due to the etching selection ratio of the metal layer to the semiconductor active layer produced by the dry etching being about 1. As a result, the characteristics of the TFT are deteriorated, which creates the display distortion.

In addition, since the metal silicide layer is not present between the signal bus line and the gate insulating layer, electromigration is easily generated in the part of the signal line bus above the scan bus line. Particularly, this electromigration is fatal in a large scale LCD apparatus which is easily warped.

SUMMARY OF THE INVENTION

It is an object of the present invention to improve the characteristics of a TFT of an LCD apparatus.

Another object is to suppress the disconnection and electromigration of a signal bus line of the LCD apparatus.

According to the present invention, in a method for manufacturing a liquid crystal display apparatus, a gate electrode is formed on an insulating substrate, and a gate insulating layer is formed on the gate electrode. Then, a semiconductor active layer is formed on the gate insulating layer. Then, a metal silicide layer is formed on the semiconductor active layer by using a sputtering process, and a metal layer is formed on the metal silicide layer. Then, the metal layer is etched by a dry etching process using a mask, and the metal silicide layer is etched by a wet etching process using the same mask. Finally, the semiconductor active layer is etched by using the metal layer as a mask.

The metal silicide layer and the metal layer form drain and source electrodes of a TFT and a signal bus connected to the drain of the TFT.

Since the metal silicide layer made by the sputtering process is relatively thick, only a part of the metal silicide layer is etched by the dry etching process for the metal layer.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, prior art LCD apparatuses will be explained with reference to FIGS. 1, 2, 3, 4, 5, 6, 7A, 7B and 7C.

Figure 1:
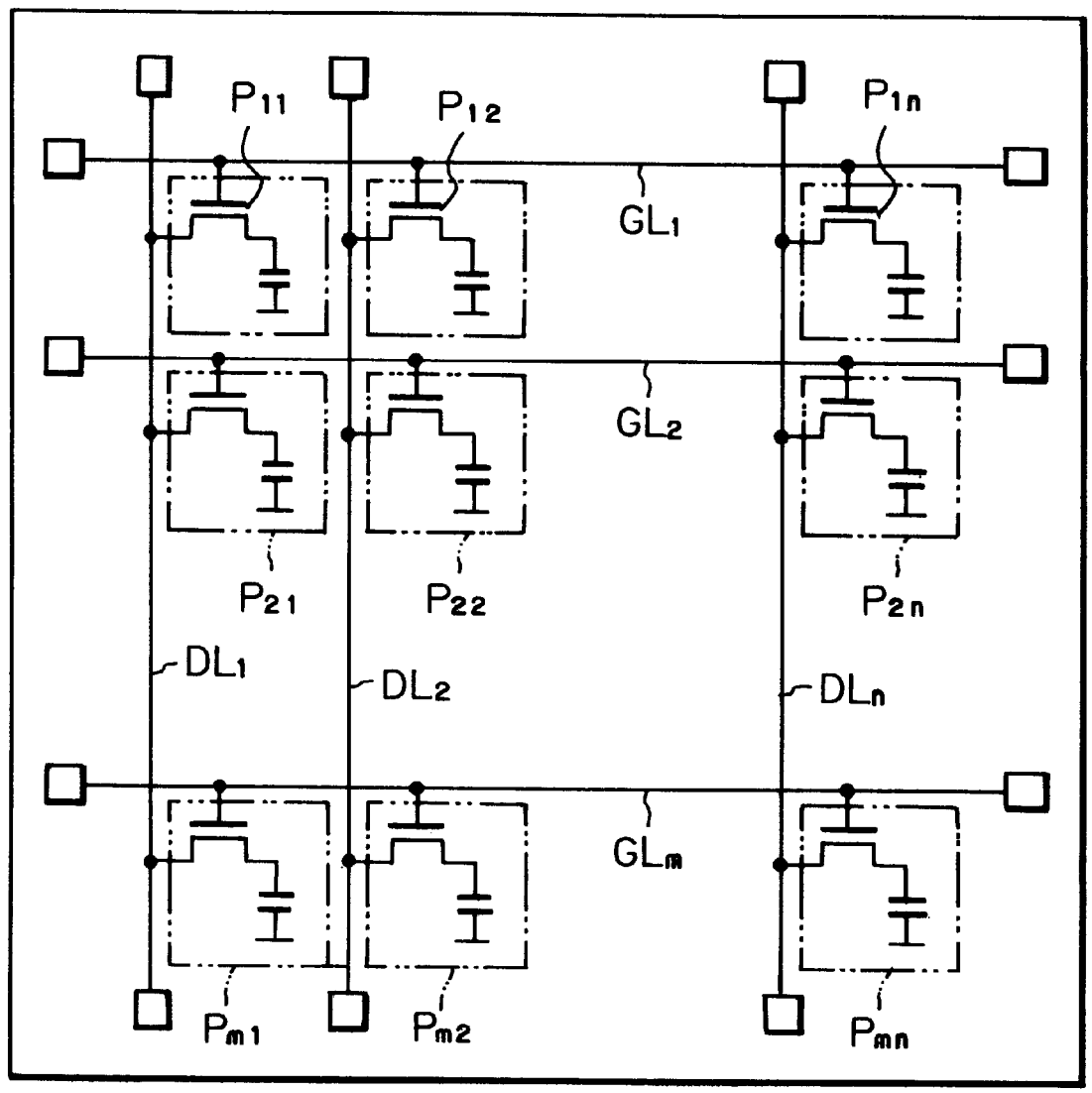
FIG. 1 is a plan view illustrating a general LCD apparatus.

In FIG. 1, which illustrates a general active matrix-type LCD apparatus references $GL_1$, $GL_2$, - - - , $GL_m$ designate scan bus lines, and $DL_1$, $DL_2$, - - - , $DL_m$ designate signal bus lines. A plurality of pixels $P_{11}$, $P_{12}$, - - - , $P_{mn}$ are provided at intersections between the scan bus lines $GL_1$, $GL_2$, - - - , $GL_m$ and the signal bus lines $DL_1$, $DL_2$, - - - , $DL_n$.

Figure 2:
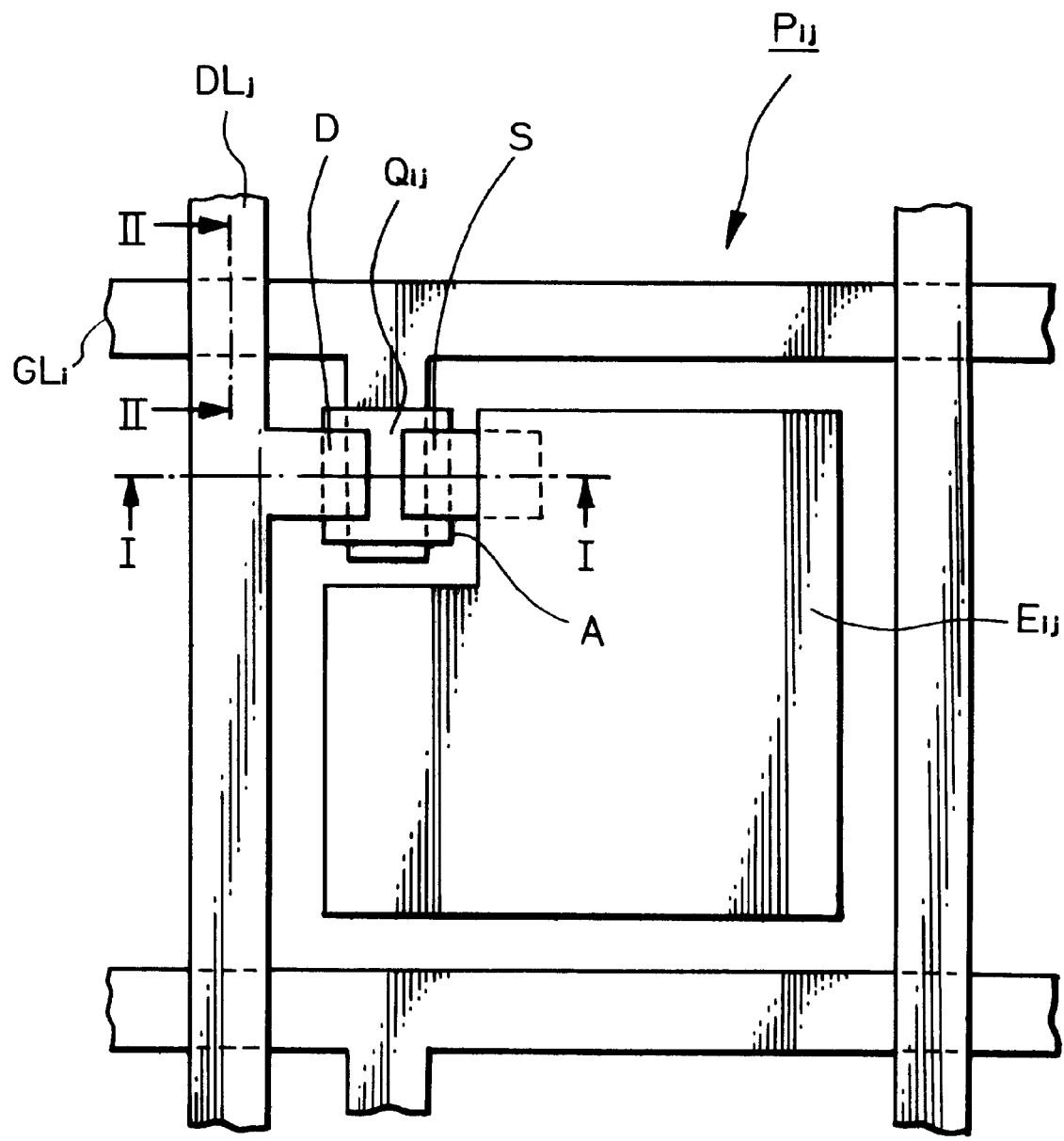
FIG. 2 is a partial plan view of the apparatus of FIG. 1.

In FIG. 2, which is an enlargement of one pixel $P_{ij}$ of FIG. 1, the pixel $P_{ij}$ is constructed by a thin film transistor (TFT) $Q_{ij}$ and a transparent pixel electrode $E_{ij}$. The TFT $Q_{ij}$ is formed by a gate electrode G shunted from the scan bus line $GL_i$, a semiconductor active layer A made of amorphous silicon opposing the gate electrode G, a drain electrode D shunted from the signal bus line $DL_j$, and a source electrode S connected to the transparent pixel electrode $E_{ij}$. One end of the semiconductor active layer A is connected to the drain electrode D, and the other end of the semiconductor active layer A is connected to the source electrode S.

Figure 3:
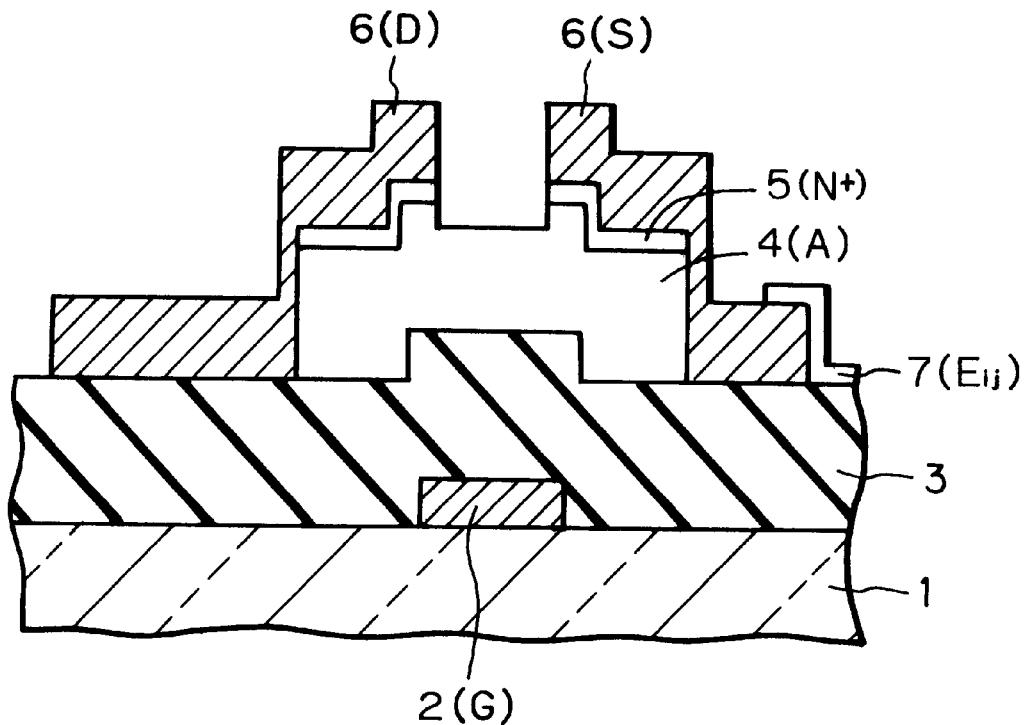
FIGS. 3 and 4 are cross-sectional views illustrating a first prior art LCD apparatus.
Figure 4:
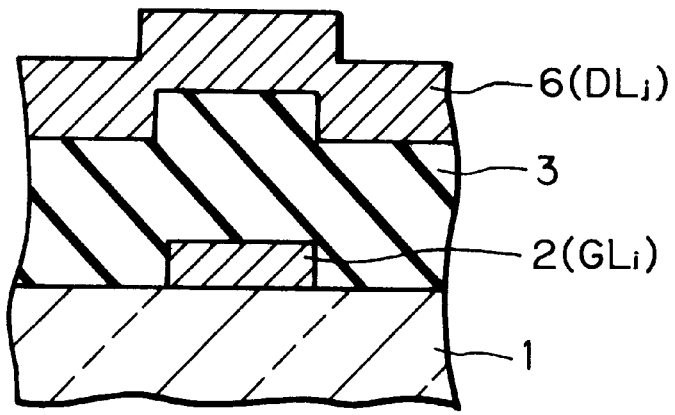

FIGS. 3 and 4 are cross-sectional views illustrating a first prior art LCD apparatus. Note that FIGS. 3 and 4 are cross-sectional views taken along the lines I—I and II—II, respectively of FIG. 2. In FIGS. 3 and 4, the TFT $Q_{ij}$ is of an inverted staggered type where the gate electrode G is beneath the semiconductor active layer A, and also, the TFT $Q_{ij}$ is of a channel etching type. That is, a conductive layer 2 is deposited on a glass substrate 1. The conductive layer 2 is patterned, so that the gate electrode G and the scan bus line $GL_1$ are formed. Also, a gate insulating layer 3 made of silicon nitride is deposited on the entire surface. Further, a non-doped amorphous silicon layer 4 is deposited, and N-type impurities are implanted into the amorphous silicon layer 4 to form an $N^+$-type impurity region 5 thereon. Further, a conductive layer 6 is deposited on the entire surface. The conductive layer 6 is patterned, so that the signal bus line $DL_j$, the drain electrode D and the source electrode S are formed. Also, the amorphous silicon layer 4 associated with the $N^+$-type impurity region 5 is etched by using the patterned conductive layer 6 as a mask, so that the semiconductor active layer A of an island shape is formed and opposes the gate electrode G. In this case, note that a channel portion of the semiconductor active layer A is partly etched.

Further, an indium tin oxide (ITO) layer 7 is deposited by a sputtering process, and is patterned to form the transparent pixel electrode $E_{ij}$.

In FIGS. 3 and 4, the drain electrode D and the source electrode S are made of a single configuration of the conductive layer 6, and the signal line $DL_j$ is also made of a single configuration of the conductive layer 6.

In the prior art apparatus of FIGS. 3 and 4, however, since the conductive layer 6 made of refractory metal is in direct contact with the amorphous silicon layer 4 (the $N^+$-type impurity region 5), a good ohmic contact cannot be obtained, so that the resistance between the conductive layer 6 and the amorphous silicon layer 4 (the $N^+$-type impurity region 5).

Figure 5:
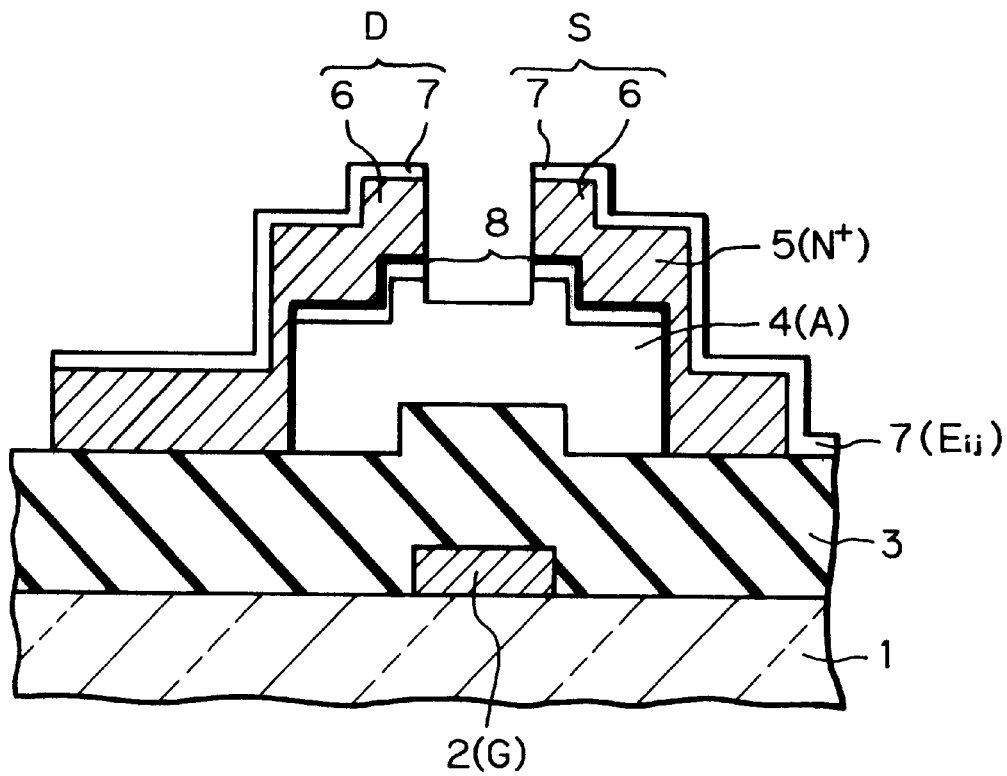
FIGS. 5 and 6 are cross-sectional views illustrating a second prior art LCD apparatus.
Figure 6:
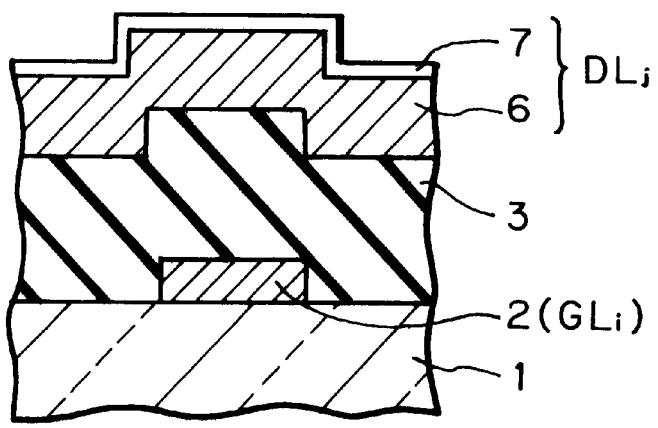

FIGS. 5 and 6 are cross-sectional views illustrating a second prior art LCD apparatus. Note that FIGS. 5 and 6 are also cross-sectional views taken along the lines I—I and II—II, respectively, of FIG. 2. In FIGS. 5 and 6, in order to obtain a good ohmic, contact between the conductive layer 6 and the amorphous silicon layer 4 (the $N^+$-type impurity region 5) of FIGS. 3 and 4, a metal silicide layer 8 is formed by reacting the conductive layer 6 with the amorphous silicon layer 4 (the $N^+$-type impurity region 5) by using a ramp annealing operation or the line at about 250 to 300° C. Also, the drain electrode D and the source electrode S are made of a double configuration of the ITO layer 7 and the conductive layer 6, and the signal line $DL_j$ is also made of a double configuration of the ITO layer 7 and the conductive layer 6.

When the conductive layer 6 is made of refractory metal such as Ta, Mo, Cr, Ti, W or Nb, the conductive layer 6 is conventionally etched by a dry etching process, using fluoric gas, not by a wet etching process. That is, if such a wet etching process is adopted, the selection of etchant is difficult, and residual refractory metal may be created, which invites a short-circuit between the drain electrode D and the source electrode S.

In the LCD apparatus of FIGS. 5 and 6, however, when the conductive layer 6 as well as the ITO layer 7 is etched by a dry etching process using fluoric gas such as $CF_4$ gas, $SF_6$ gas or a mixture gas of $CF_6$ and $O_2$ or $SF_6$ and $Cl_2$, the overetching of the conductive layer 6 invites an etching of the $N^+$-type impurity region 5.

Figure 7A:
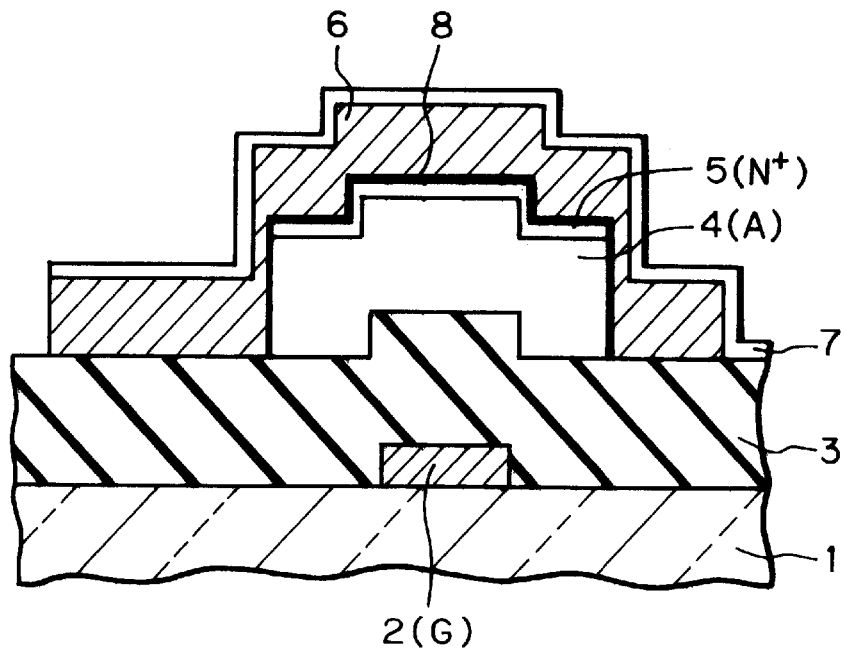
FIGS. 7A, 7B and 7C are cross-sectional views for explaining the manufacturing steps of the apparatus of FIG. 5.
Figure 7B:
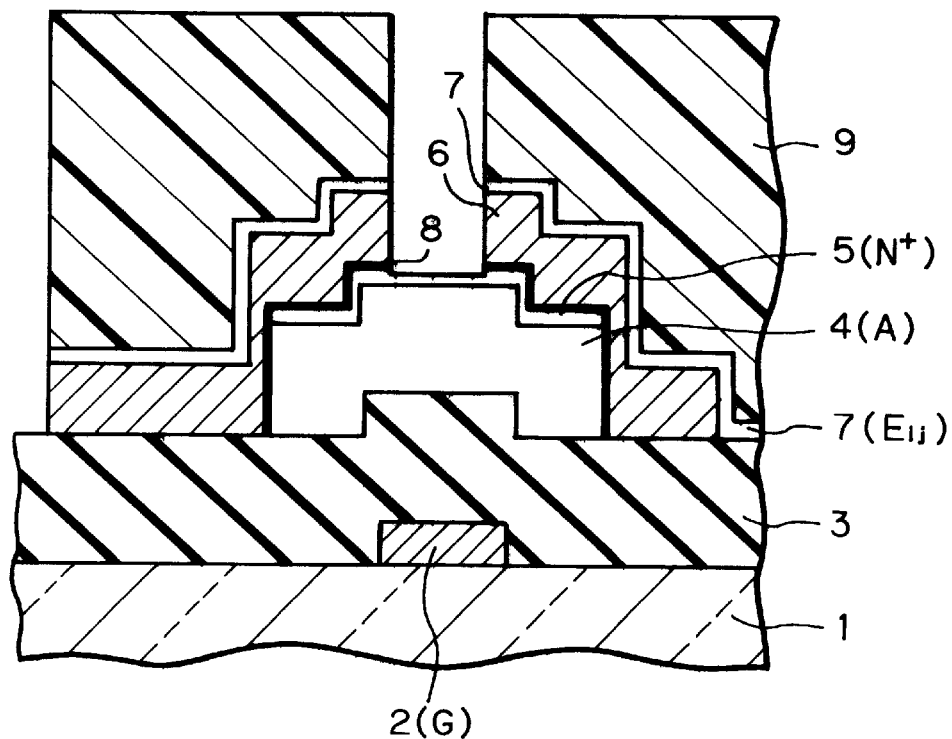
Figure 7C:
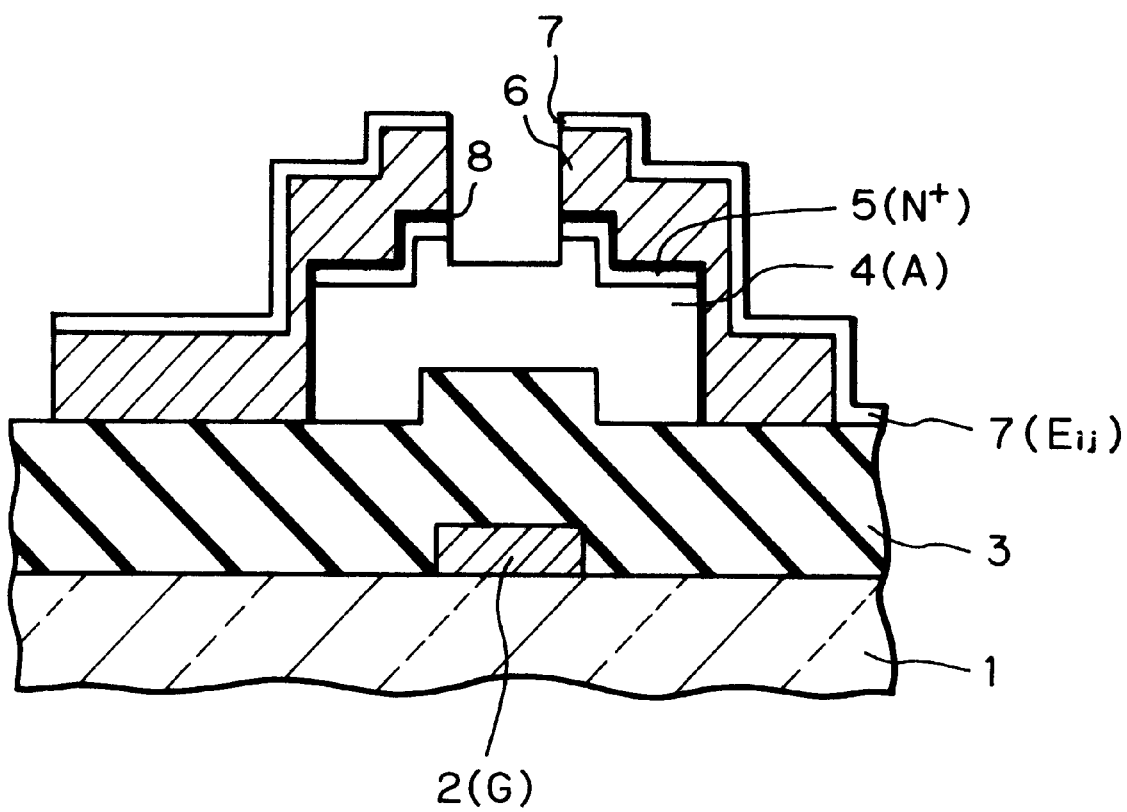

In more detail, the LCD apparatus of FIG. 5 is manufactured as shown in FIGS. 7A and 7B. That is, after the conductive layer 2, the gate insulating layer 3, the amorphous silicon layer 4, the $N^+$-type impurity region 5, the conductive layer 6, the ITO layer 7 and the metal silicide layer 8 are formed as illustrated in FIG. 7A, a photoresist pattern 9 is formed as illustrated in FIG. 7B. In this state, when the above-mentioned dry etching process is carried out so that the conductive layer 6 is etched, the metal silicide layer 8 is also completely etched, since the etching selection ratio of the conductive layer 6 to the metal silicide layer 8 is about 2 and the metal silicide layer 8 is too thin. As a result, the $N^+$-type impurity region 5 is also etched. Note that the etched amount of the $N^+$-type impurity region reproducible due to the etching selection ratio of the conductive layer 6 to the $N^+$-type impurity region (silicon) 5 by the fluoric gas is about 1. Then, as illustrated in FIG. 7C, after the photoresist pattern 9 is removed, the $N^+$-type impurity region 5 and the amorphous silicon layer 4 are etched by a dry etching process using a mixture gas of $CF_4$ and $O_2$, $SF_6$ and $Cl_2$, or $SF_6$ and HCl.

Thus, since the etched amount of the $N^+$-type impurity region 5 is not reproducible, the etched amount of the amorphous silicon layer 4 is not reproducible, either. As a result, the characteristics of the TFT $Q_{ij}$ are deteriorated, which creates the display distortion.

In addition, as illustrated in FIG. 6, since the metal silicide layer 8 is not present between the signal bus line $DL_j$ and the gate insulating layer 3, electromigration is easily generated in the part of the signal line bus $DL_j$ above the scan bus line $GL_i$. Particularly, this electromigration is fatal in a large scale LCD apparatus which is easily warped.

Figure 8:
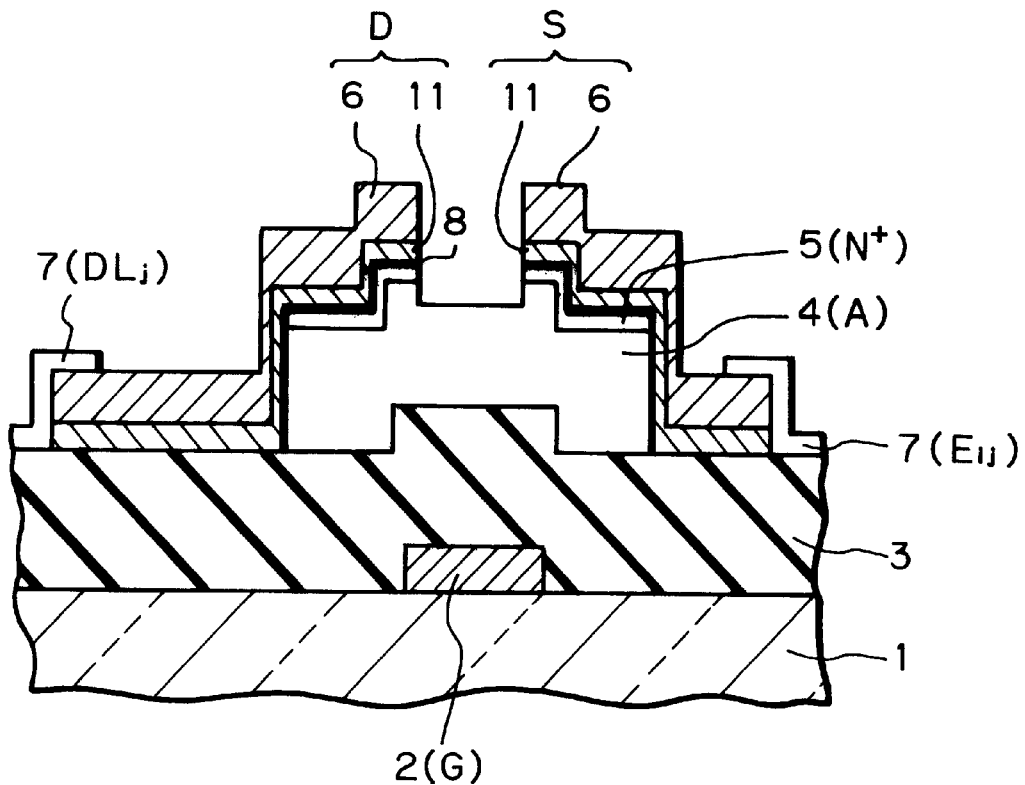
FIGS. 8 and 9 are cross-sectional views illustrating a first embodiment of the LCD apparatus according to the present invention.
Figure 9:
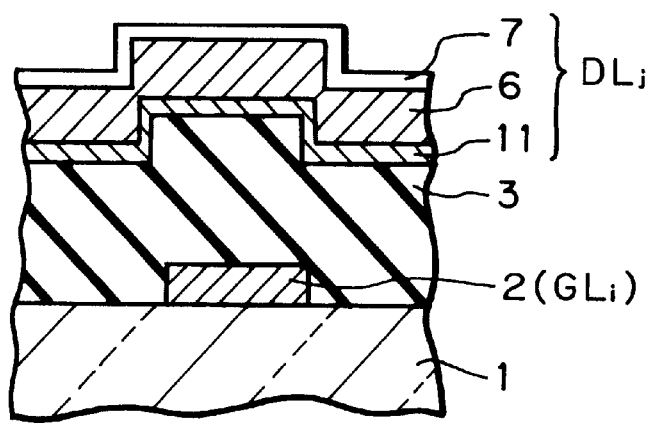

FIGS. 8 and 9 are cross-sectional views illustrating a first embodiment of the LCD apparatus according to the present invention. Note that FIGS. 8 and 9 are also cross-sectional views taken along the line I—I and II—II, respectively, of FIG. 2. In FIGS. 8 and 9, a metal silicide layer 11 made by a sputtering process is formed beneath the conductive layer 6 of FIGS. 5 and 6. As a result, the drain electrode D and the source electrode S are made of a double configuration of the conductive layer 6 and the metal silicide layer 11, and the signal bus line $DL_j$ is made of a triple configuration of the ITO layer 7, the conductive layer 6 and the metal silicide layer 11.

The manufacturing steps of the LCD apparatus of FIG. 8 will be explained next with reference to FIGS. 10A through 10D.

Figure 10A:
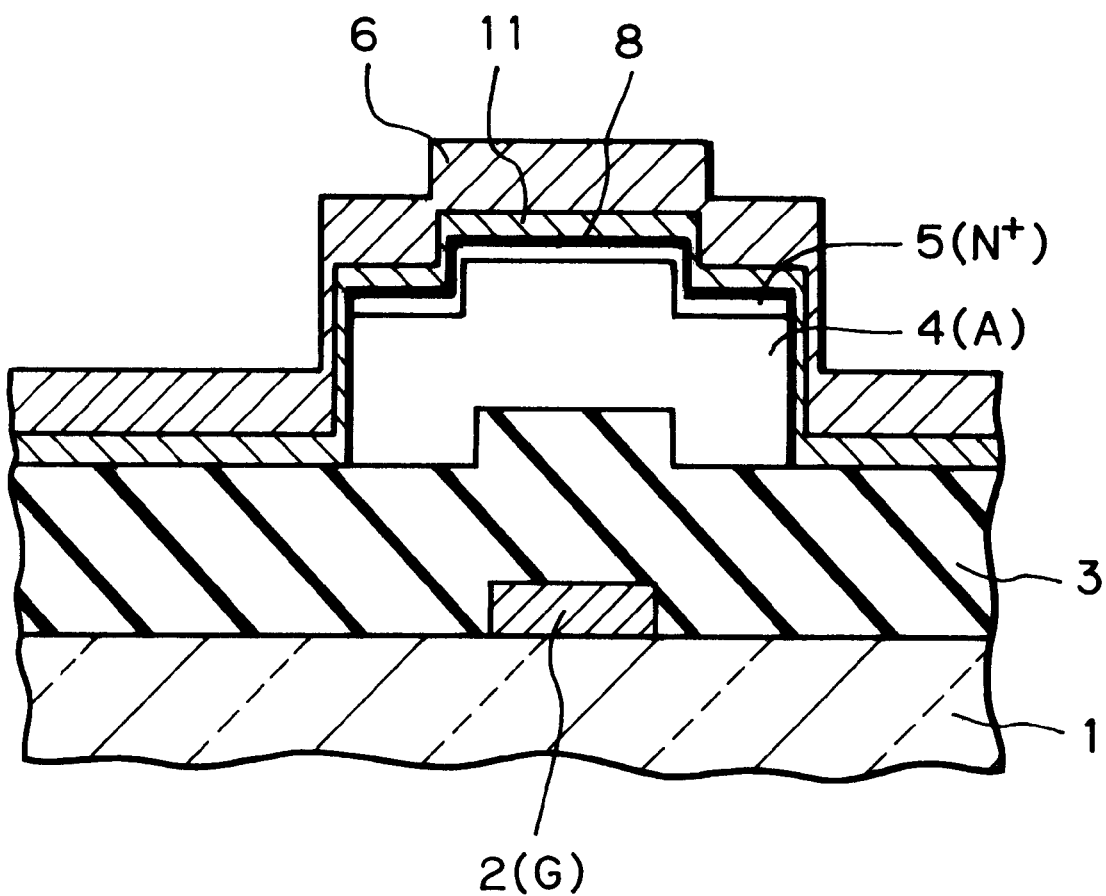
FIGS. 10A through 10D are cross-sectional views for explaining the manufacturing steps of the apparatus of FIG. 8.

First, referring to FIG. 10A, a conductive layer 2 made of Ta, Cr, Mo or W is deposited on a transparent insulating substrate 1, and is patterned by a photolithography process, so that the gate electrode G and the scan bus line $GL_i$ (see FIG. 2) are formed. Then, a silicon nitride layer is deposited by a plasma chemical vapor deposition (CVD) process to form the gate insulating layer 3. Note that the gate insulating layer 3 can be made of a double configuration of silicon oxide deposited by a sputtering process and silicon nitride deposited thereon. Also, if the gate electrode G is made of Ta or Mo, the gate insulating layer 3 can include an insulating layer obtained by anodic-oxidating Ta or Mo.

Next, a non-doped amorphous silicon layer and a phosphorus-including amorphous silicon layer are sequentially deposited on the gate insulating layer 3. Then, the non-doped amorphous silicon layer and the phosphorus-including amorphous silicon layer are patterned by a photolithography process, so that the non-doped amorphous silicon layer 4 and an N$^+$-type silicon layer 5 are formed. Note that the N$^+$-type amorphous silicon layer 5 can be obtained by doping phosphorous ions into the non-doped amorphous silicon layer 4.

Next, an about 50 nm thick tungsten silicide layer and an about 150 nm thick tangsten layer are sequentially deposited by a sputtering process at a substrate temperature of about 200° C. As a result, the metal silicide layer 11 made of tungsten silicide and the conductive layer 6 made of tungsten are formed. Simultaneously, the tungsten silicide layer reacts with the amorphous silicon layers 5 and 4, so that the metal silicide layer 8 made of about 5 to 10 nm thick tungsten silicide is formed therebetween. In this case, the composition x of WSi$_x$ of the metal silicide layer 11 is about 2 to 3, and the composition of y of WSi$_y$ of the metal silicide layer 8 is a little smaller than x. Thus, the total thickness of the metal silicide layer 8 and 11 is about 60 nm.

Figure 10B:
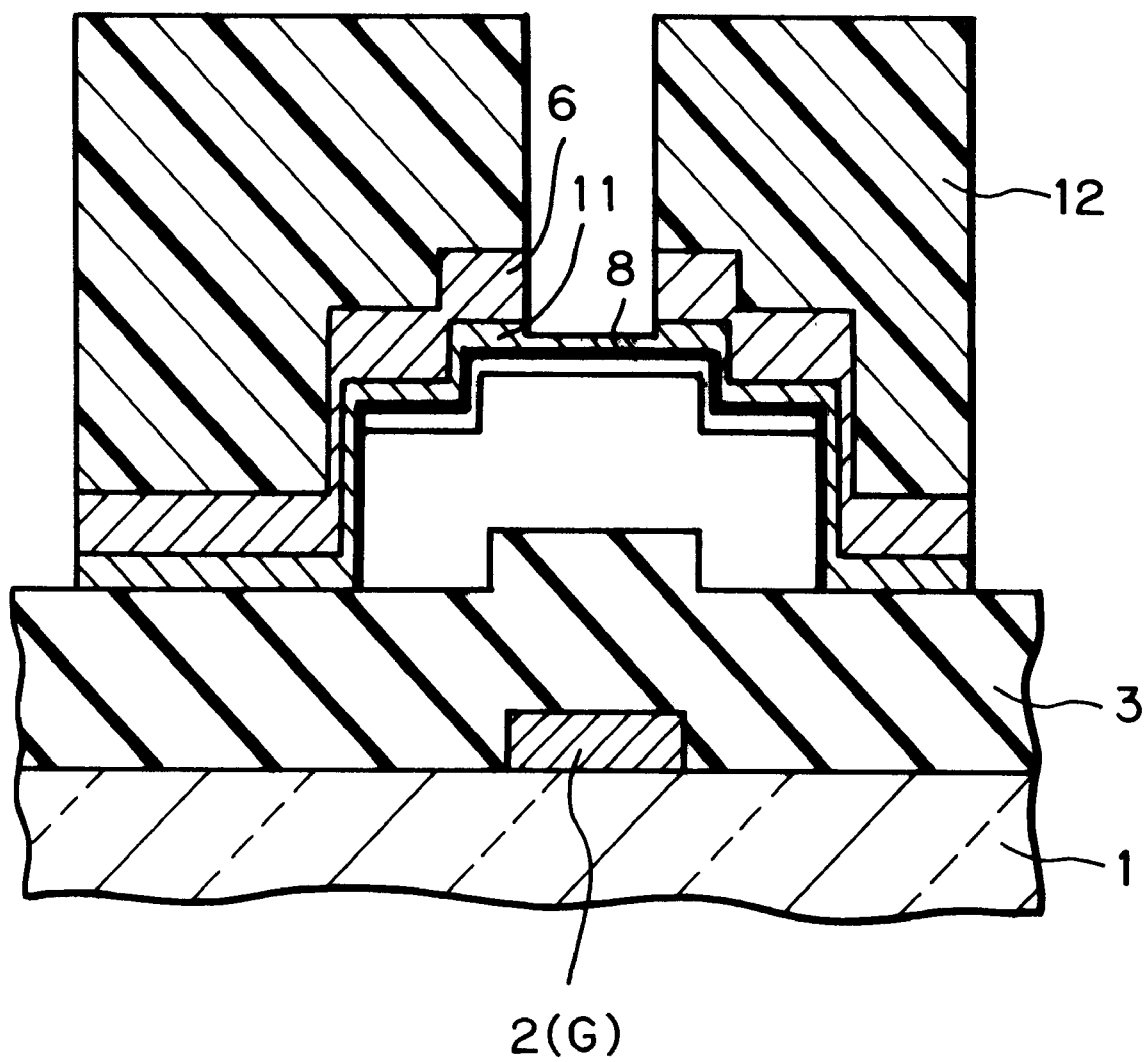

Next, referring to FIG. 10B, a photoresist pattern 12 is formed to cover a drain electrode forming area, a source electrode forming area and a signal bus line forming area. Then, a dry etching process using CF$_4$ gas, SF$_4$ gas, or a mixture gas of CF$_6$ and O$_2$ or SF$_4$ and O$_2$ is performed upon the conductive layer (W) 6, so that the conductive layer 6 is completely etched. In this case, since the etching selection ratio of the conductive layer (W) 6 to the metal silicide layers (WSi) 11 and 8 is about 2 and the total thickness of the metal silicide layers 11 and 8 is thick (about 60 nm), only a part of the metal silicide layers 11 and 8 is etched.

For example, if the conductive layer (W) 6 is 150 nm thick, the fluctuation of etching rate is 30 percent within a substrate, and the above-mentioned etching selection ratio is 2, the thickness of at most 23 nm of the metal silicide layer 11 is etched. Also, if the conductive layer (W) 6 is 200 nm thick, the fluctuation of etching rate is 50 percent within a substrate, and the above-mentioned etching selection ratio is 2, the thickness of at most 95 nm of the metal silicide layer 11 is etched. On the other hand, since the resistance of metal silicide is ten times that of metal, the thickness of the metal silicide layer 11 is as thin as possible. In view of this, although the thickness of the metal silicide layer 11 is dependent upon the thickness of the conductive layer 6, the fluctuation of etching rate and the etching selection ratio, the thickness of the metal silicide layer 11 is preferably about 30 to 100 nm.

Figure 10C:
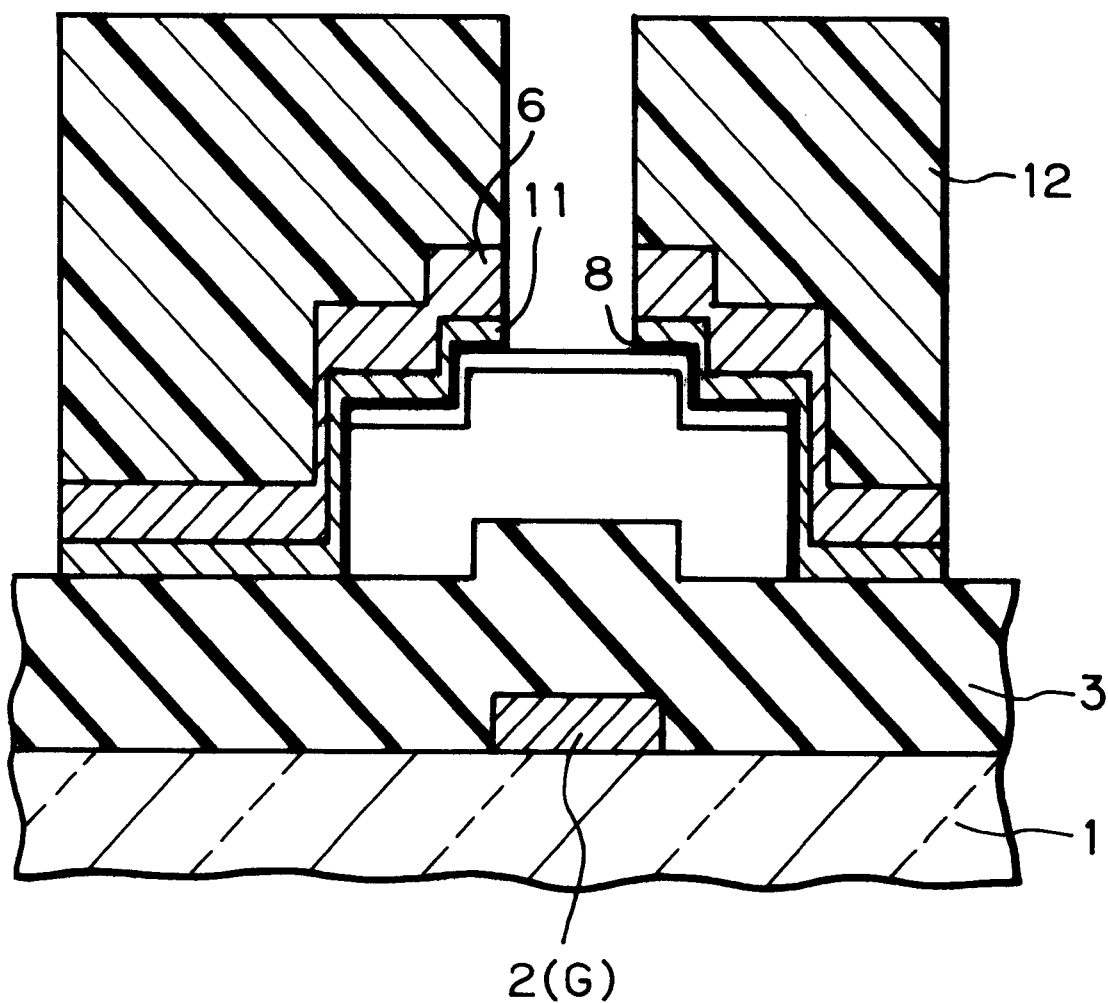

Next, referring to FIG. 10C, a wet etching process using lean fluoric acid or lean buffered fluoric acid is performed upon the metal silicide layers 11 and 8 with a mask of the conductive layer 6. In this case, the N$^+$-type amorphous silicon layer 5 is hardly etched. Then, the photoresist pattern 12 is removed.

Figure 10D:
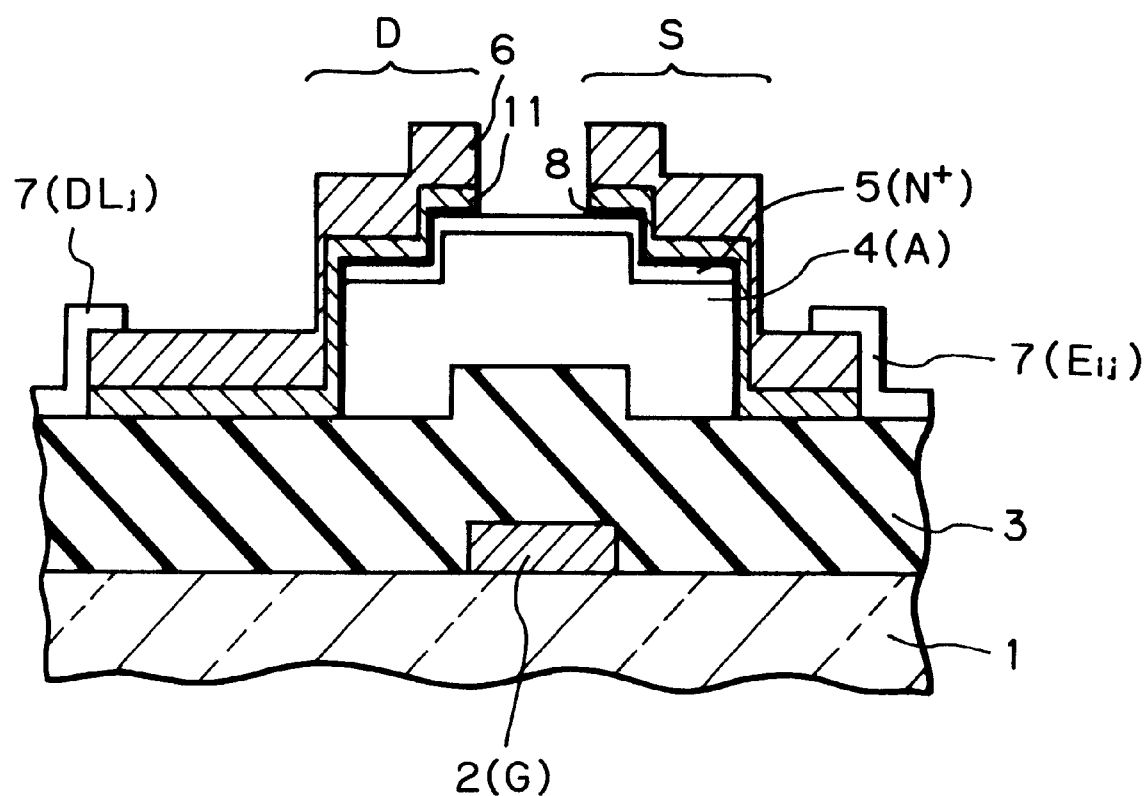

Next, referring to FIG. 10D, an ITO layer 7 is formed and is patterned by a photolithography process, so that the pixel electrode E$_{ij}$ and the signal bus line DL$_j$ are formed. In this case, note that the signal bus line DL$_j$ includes the conductive layer 6 the metal silicide layer 11 (see FIG. 9).

Finally, a dry etching process using CF$_4$ gas, SF$_4$ gas, or a mixture gas of CF$_4$ and O$_2$ or SF$_6$ and O$_2$ is performed upon the amorphous silicon layers 5 and 4 with a mask of the drain electrode D and the source electrode S. Thus, the structure as illustrated in FIG. 8 can be obtained. In this case, the etching of the amorphous silicon layers 5 and 4 can be homogeneous within the substrate.

Note that, if the conductive layer 6 is made of W, the conductive layer 6 is not etched by the above-mentioned wet etching process. Therefore, even if the metal silicide layer 11 above the scan bus line GL$_i$ (see FIG. 9) is etched by the wet etching process, the conductive layer 6 can prevent the signal bus line DL$_j$ above the scan bus line GL$_i$ from being disconnected. Also, if the conductive layer 6 is made of Ta or Cr, the conductive layer 6 is slightly etched by the above-mentioned wet etching process. However, since the etching selection ratio of silicide to Ta or Cr is remarkably large, even if the metal silicide layer 11 above the scan bus line GL$_i$ (see FIG. 9) is etched by the wet etching process, the conductive layer 6 can substantially prevent the signal bus line DL$_j$ above the scan bus line GL$_i$ from being disconnected.

Figure 11:
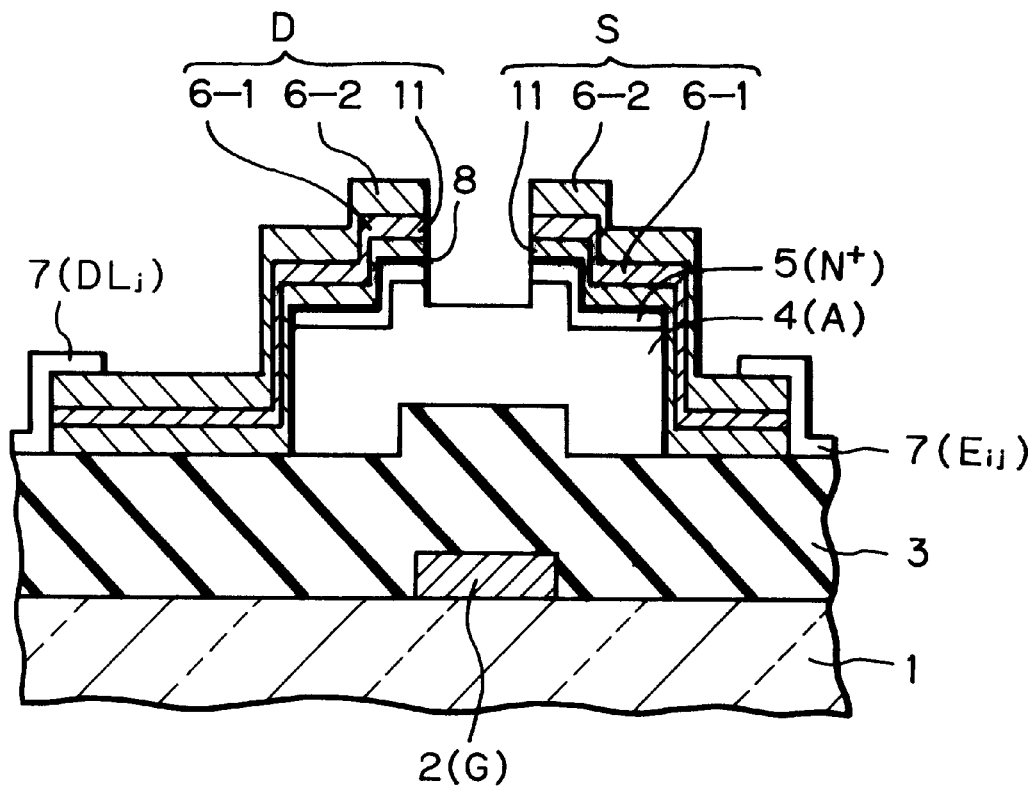
FIGS. 11 and 12 are cross-sectional views illustrating a second embodiment of the LCD apparatus according to the present invention.
Figure 12:
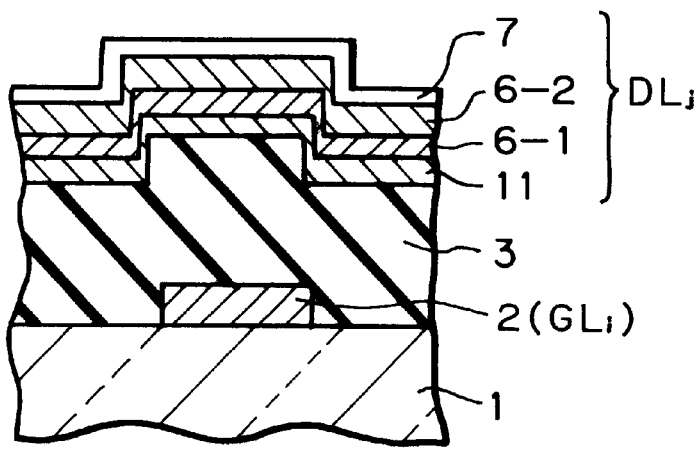

FIGS. 11 and 12 are cross-sectional views illustrating a second embodiment of the LCD apparatus according to the present invention. Note that FIGS. 11 and 12 are also cross-sectional vies taken along the lines I—I and II—II, respectively, of FIG. 2. In FIGS. 11 and 12, the conductive layer 6 of FIGS. 8 and 9 is replaced by two conductive layers 6-1 and 6-2 made of tantalum nitride (TaN) tantalum (Ta). Also, the metal silicide layer 11 of FIGS. 8 and 9 is made of tantalum silicide (TaSi). Note that, if Ta is directly deposited on TaSi, β-Ta having a large resistivity is formed. Therefore, in order to obtain α-Ta having a small resistivity, the TaN layer 6-1 is provided.

The manufacturing steps of the LCD apparatus of FIG. 11 will be explained next with reference to FIGS. 13A, 13B, 13C and 13D.

Figure 13A:
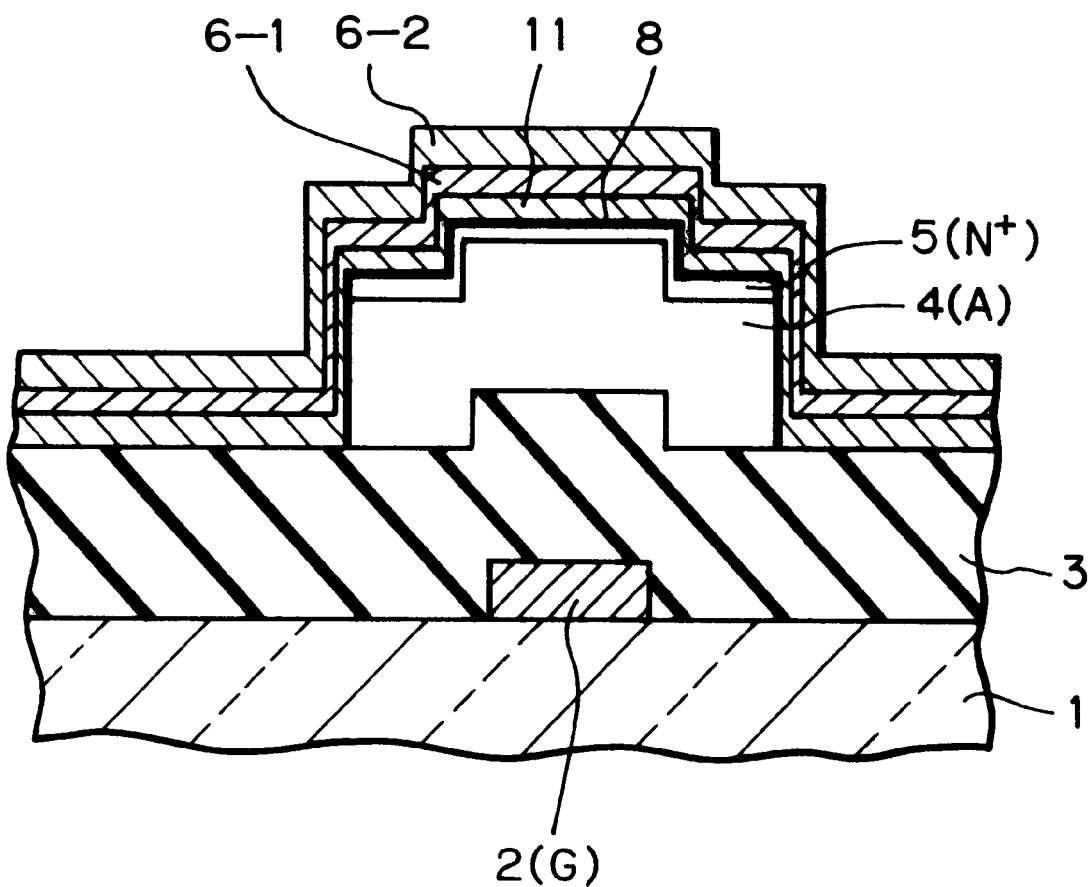
FIGS. 13A through 13D are cross-sectional views for explaining the manufacturing steps of the apparatus of FIG. 11.

First referring to FIG. 13A, in the same way as in FIG. 10A, a conductive layer 2 made of Ta, Cr, Mo or W is deposited on a transparent insulating substrate 1, and is patterned by a photolithography process, so that the gate electrode G and the scan bus line GL$_i$ (see FIG. 2) are formed. Then, a silicon nitride layer is deposited by a plasma CVD process to form the gate insulating layer 3. The non-doped amorphous silicon layer and a phosphorus-including amorphous silicon layer are sequentially deposited on the gate insulating layer 3. Then, non-doped amorphous silicon layer and the phosphorus-including amorphous silicon layer are patterned by a photolithography process, so that the non-doped amorphous silicon layer 4 and an N$^+$-type amorphous silicon layer 5 are formed.

Next, an about 50 nm thick tantalum silicide layer, and about 30 nm thick tantalum nitride layer, and an about 150 nm thick tantalum layer are sequentially deposited by a sputtering process at a substrate temperature of about 200° C. As a result, the metal silicide layer 11 made of tantalum silicide, the conductive layer 6-1 made of TaN, and the conductive layer 6-2 made of Ta are formed. Simultaneously, the tantalum silicide layer reacts with the amorphous silicon layers 5 and 4 so that the metal silicide layer 8 made of about 5 to 10 nm thick tantalum silicide is formed therebetween. In this case, the composition x of TaSi$_x$ of the metal silicide layer 11 is about 2 to 3, and the composition y of TaSi$_y$ of the metal silicide layer 8 is a little smaller than x. Thus, the total thickness of the metal silicide layers 8 and 11 is about 60 nm.

Figure 13B:
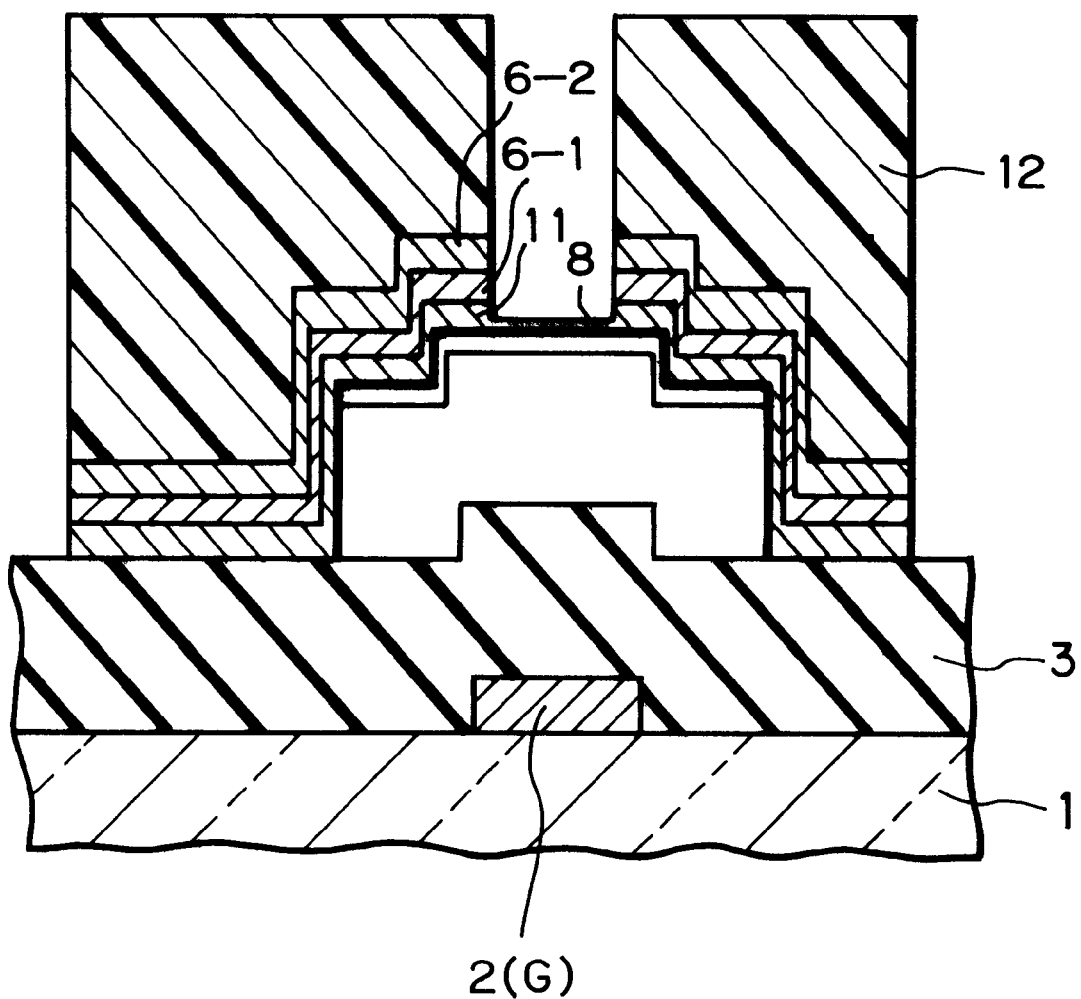

Next, referring to FIG. 13B, in the same way as FIG. 10B, a photoresist pattern 12 is formed to cover a drain electrode forming area, a source electrode forming area and a signal bus line forming area. Then, a dry etching process using CF$_4$ gas, SF$_4$ gas, or a mixture gas of CF$_0$ and O$_2$ or SF$_4$ and O$_2$ is performed upon the conductive layers (Ta/TaN) 6, so that the conductive layer 6 is completely etched. In this case, since the etching selection ratio of the conductive layers (Ta/TaN) 6 to the metal silicide layers (TaSi) 11 and 8 is about 2 and the total thickness of the metal silicide layers 11 and 8 is thick (about 60 nm), only a part of the metal silicide layers 11 and 8 is etched.

Also, in the second embodiment, although the thickness of the metal silicide layer 11 is dependent upon the thickness of the conductive layers 6-1 and 6-2, the fluctuation of etching rate and the etching selection ratio, the thickness of the metal silicide layer 11 is preferably about 30 to 100 nm.

Figure 13C:
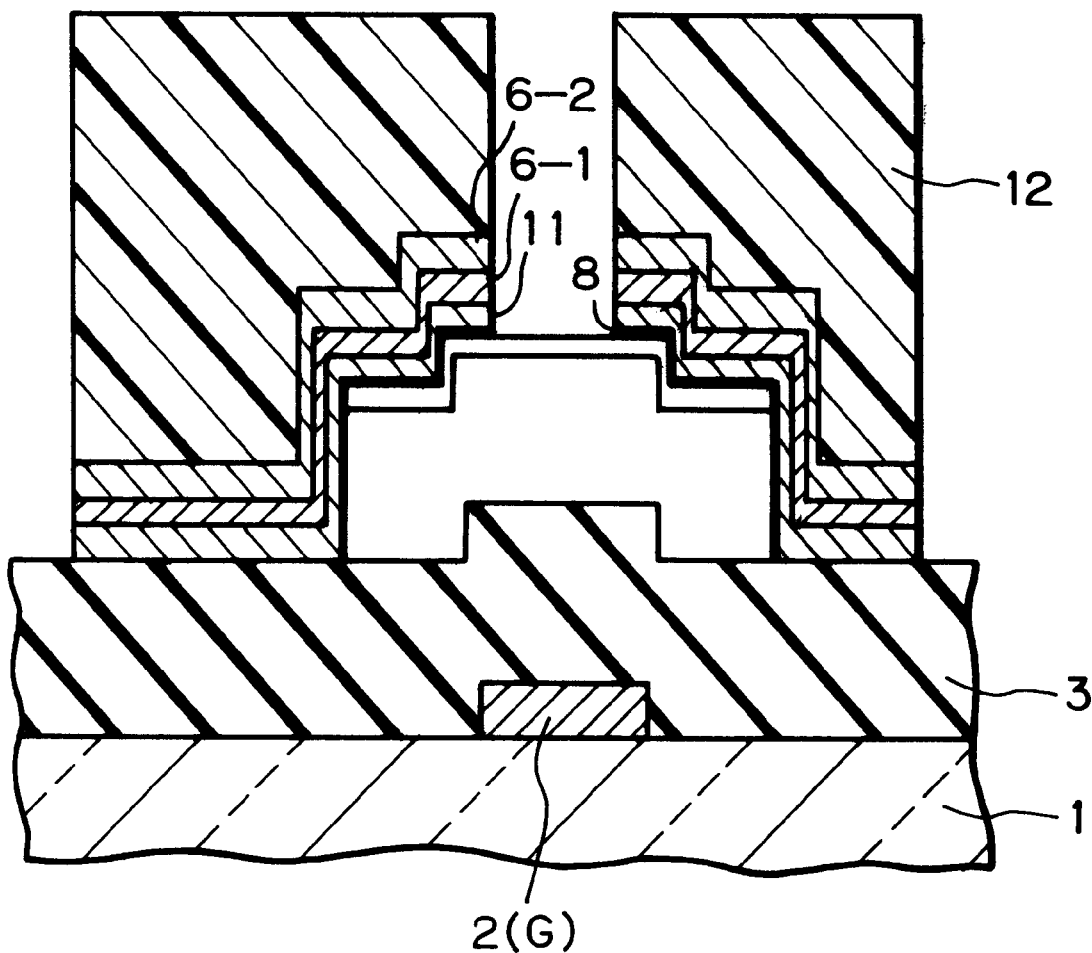

Next, referring to FIG. 13C, in the same way as in FIG. 10C, a wet etching process using lean fluoric acid or lean buffered fluoric acid is performed upon the metal silicide layers 11 and 8 with a mask of the conductive layers 6-1 and 6-2. In this case, the $N^+$-type amorphous silicon layer 5 is hardly etched. Then, the photoresist pattern 12 is removed.

Figure 13D:
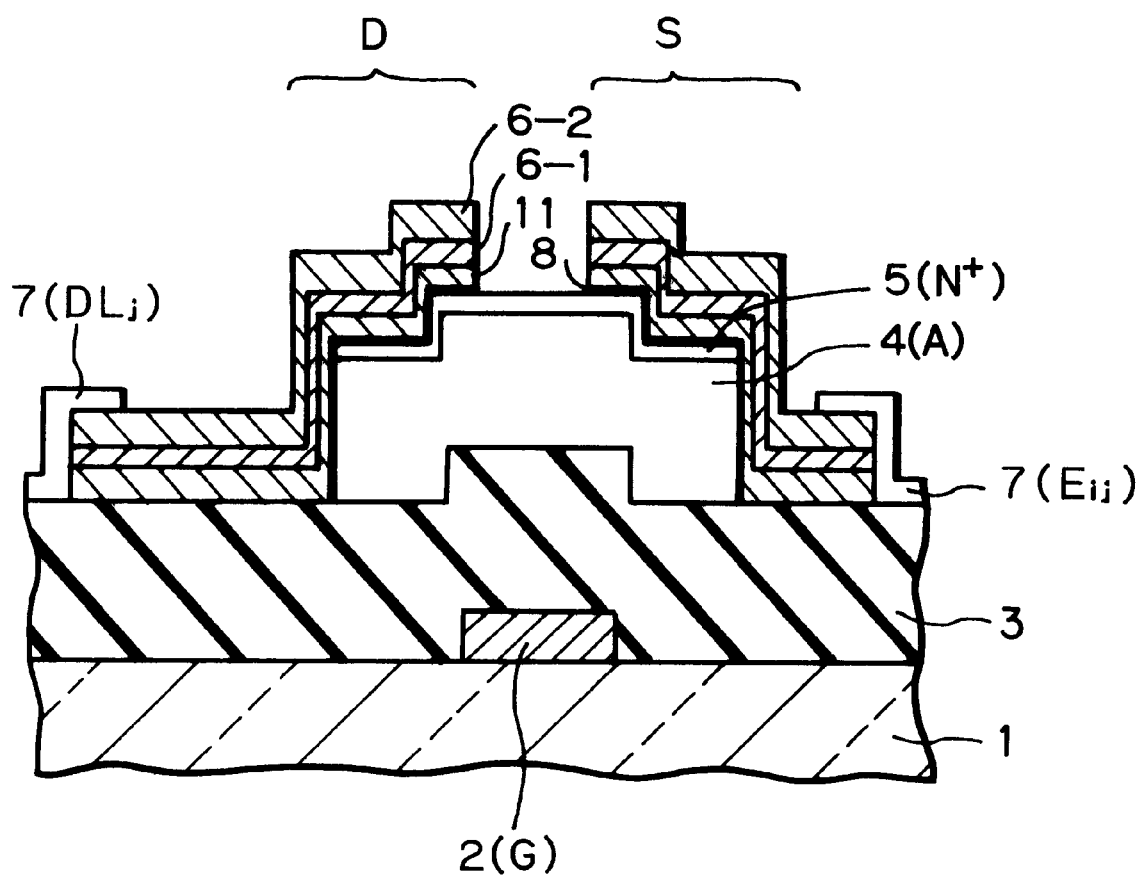

Next, referring to FIG. 13D, in the same way as in FIG. 10D, and ITO layer 7 is formed and is patterned by a photolithography process, so that the pixel electrode $E_{ij}$ and the signal bus line $DL_j$ are formed. In this case, note that the signal bus line $DL_j$ includes the conductive layer 6 and the metal silicide layer 11 (see FIG. 12).

Finally, a dry etching process using $CF_4$ gas, $SF_6$ gas, or a mixture gas of $CF_4$ and $O_2$ or $SF_6$ and $O_2$ is performed upon the amorphous silicon layers 5 and 4 with a mask of the drain electrode D and the source electrode S. Thus, the structure as illustrated in FIG. 11 can be obtained. In this case, the etching of the amorphous silicon layers 5 and 4 can be homogeneous within the substrate.

Figure 14:
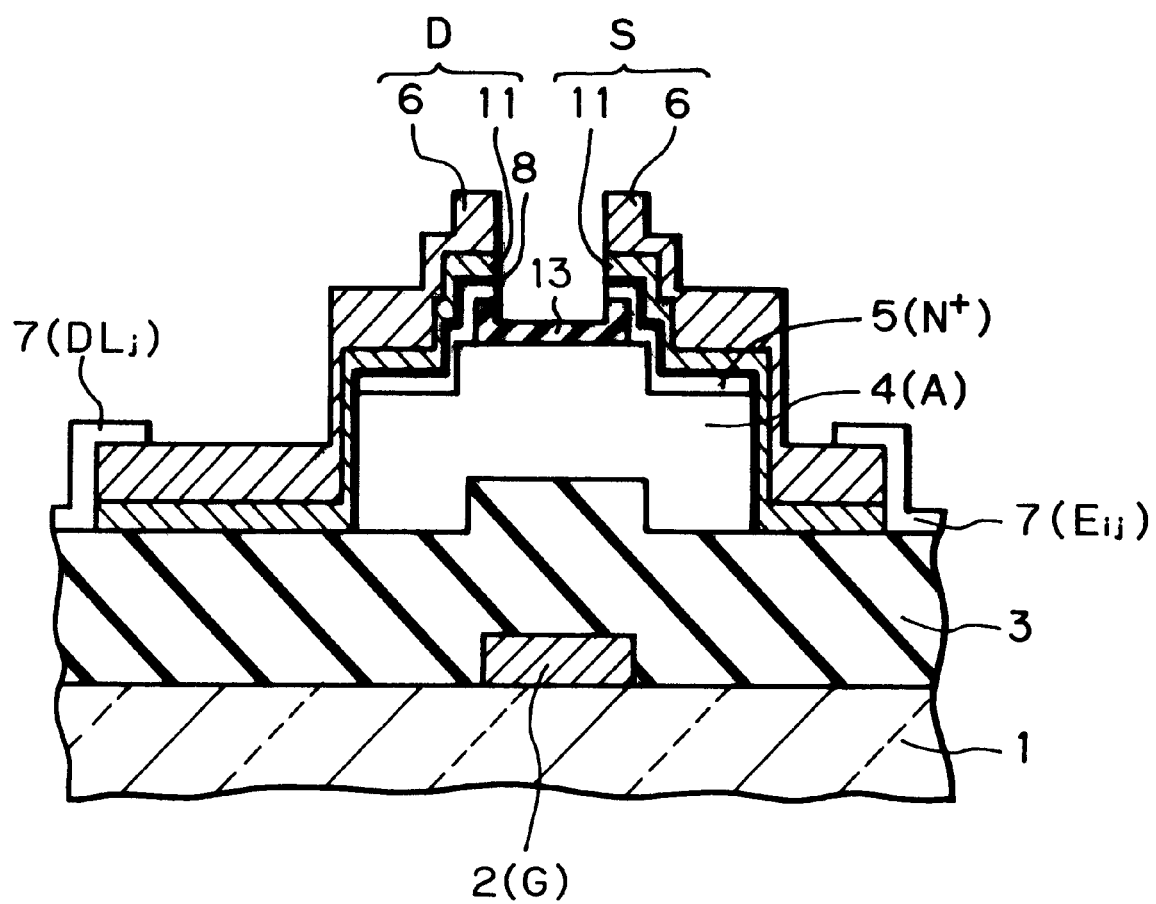
FIGS. 14 and 15 are cross-sectional views of modifications of FIGS. 8 and 11, respectively.
Figure 15:
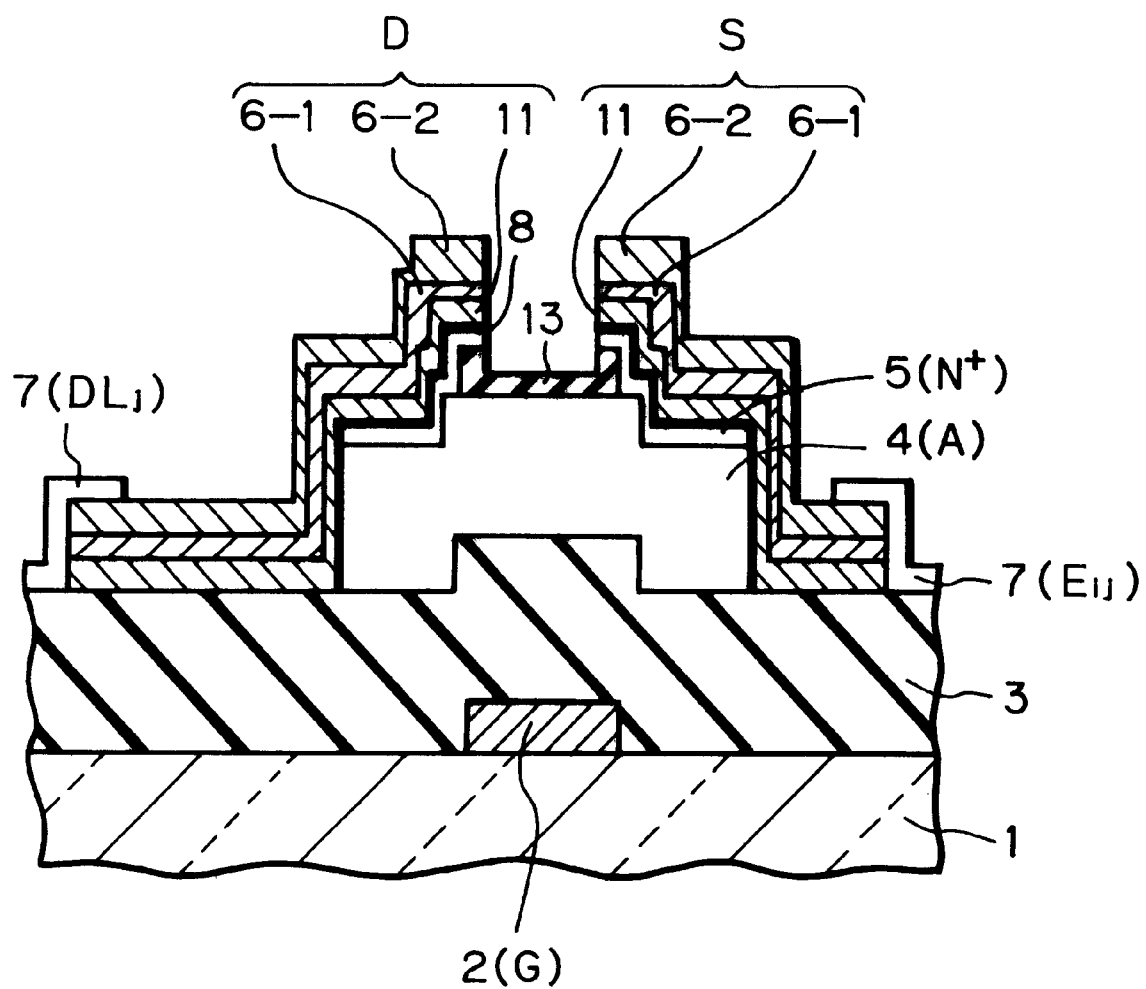

The above-described first and second embodiments relate to a channel-etching type thin film transistor; however, the first and second embodiments can be applied to a channel-protection type thin film transistor as illustrated in FIGS. 14 and 15. That is, an etching protection layer 13 made of silicon nitride is interposed between the amorphous silicon layer 4 and the $N^+$-type amorphous silicon layer 5 of FIGS. 8 and 11, thus preventing the amorphous silicon layer 4 from being etched during the above-mentioned wet etching process.

Figure 16A:
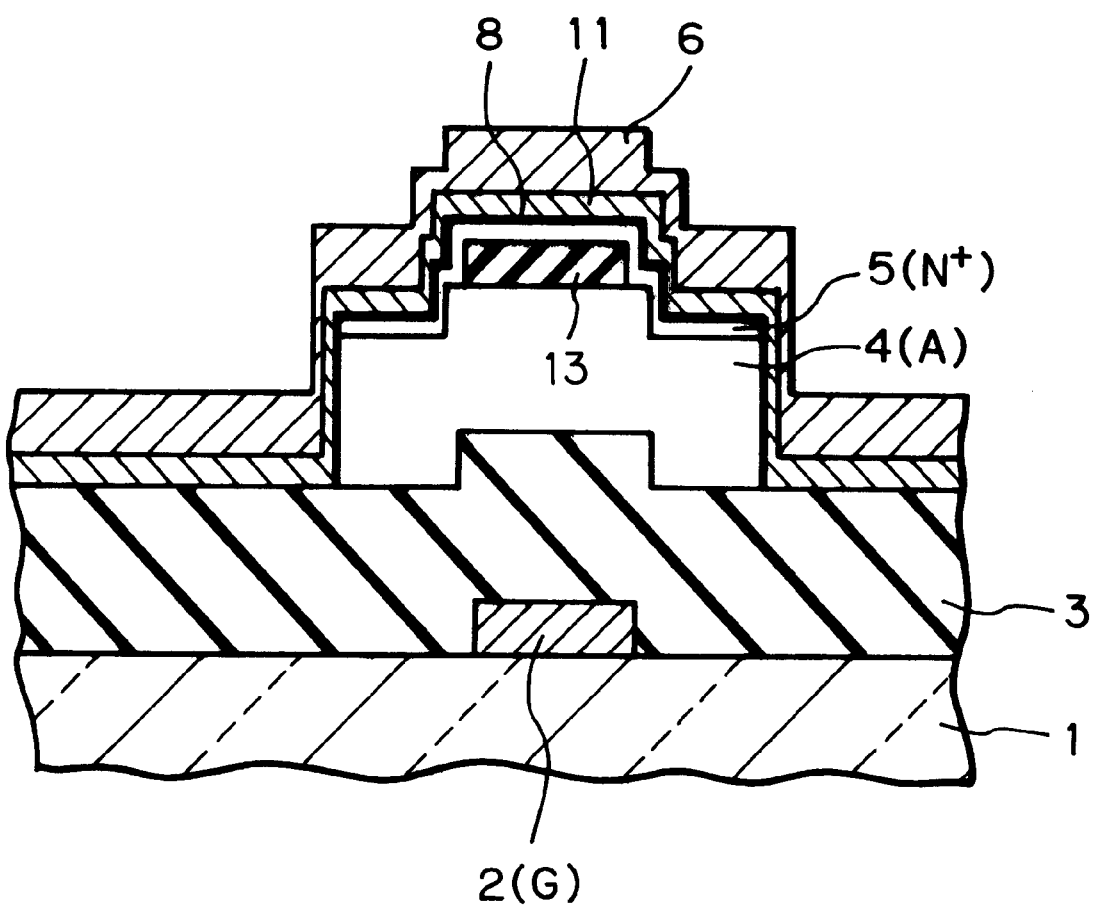
FIGS. 16A, 16B, 16C and 16D are cross-sectional views for explaining the manufacturing steps of the apparatus of FIG. 14.
Figure 16B:
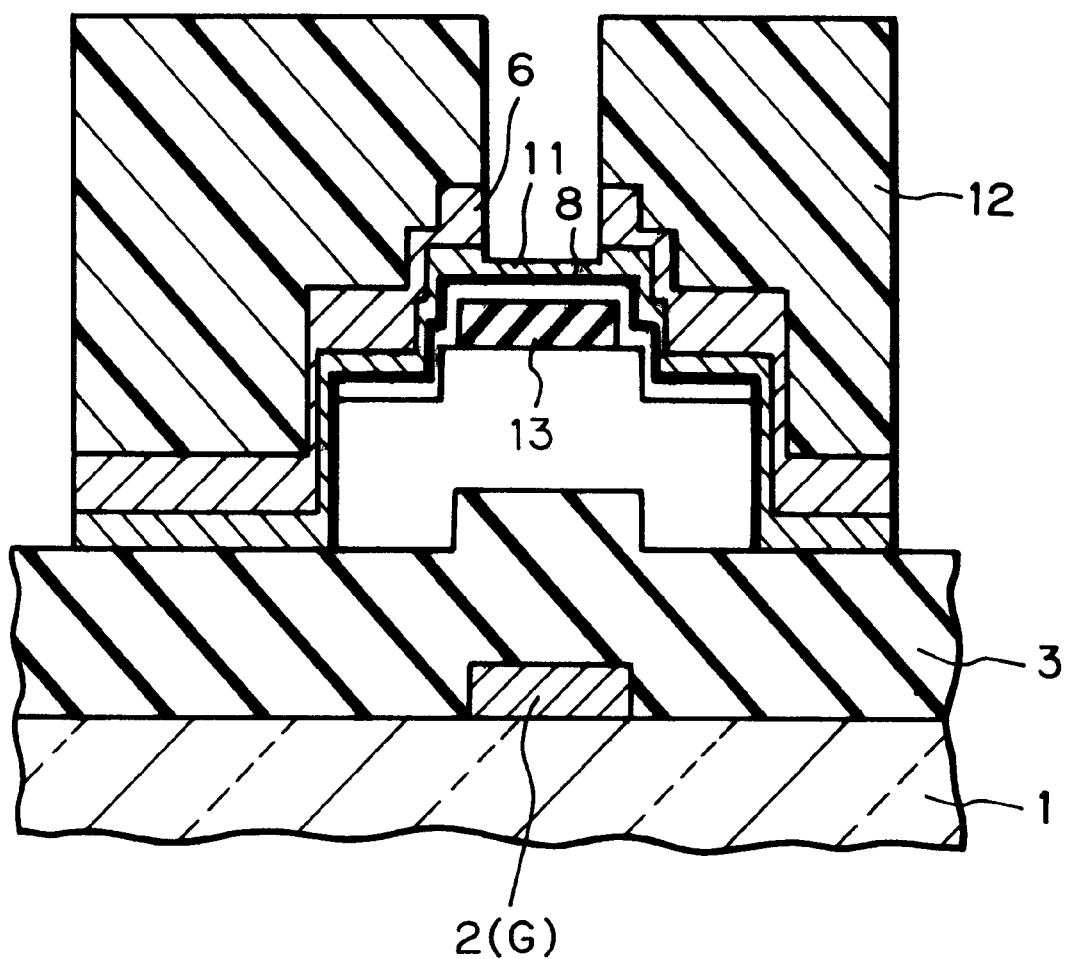
Figure 16C:
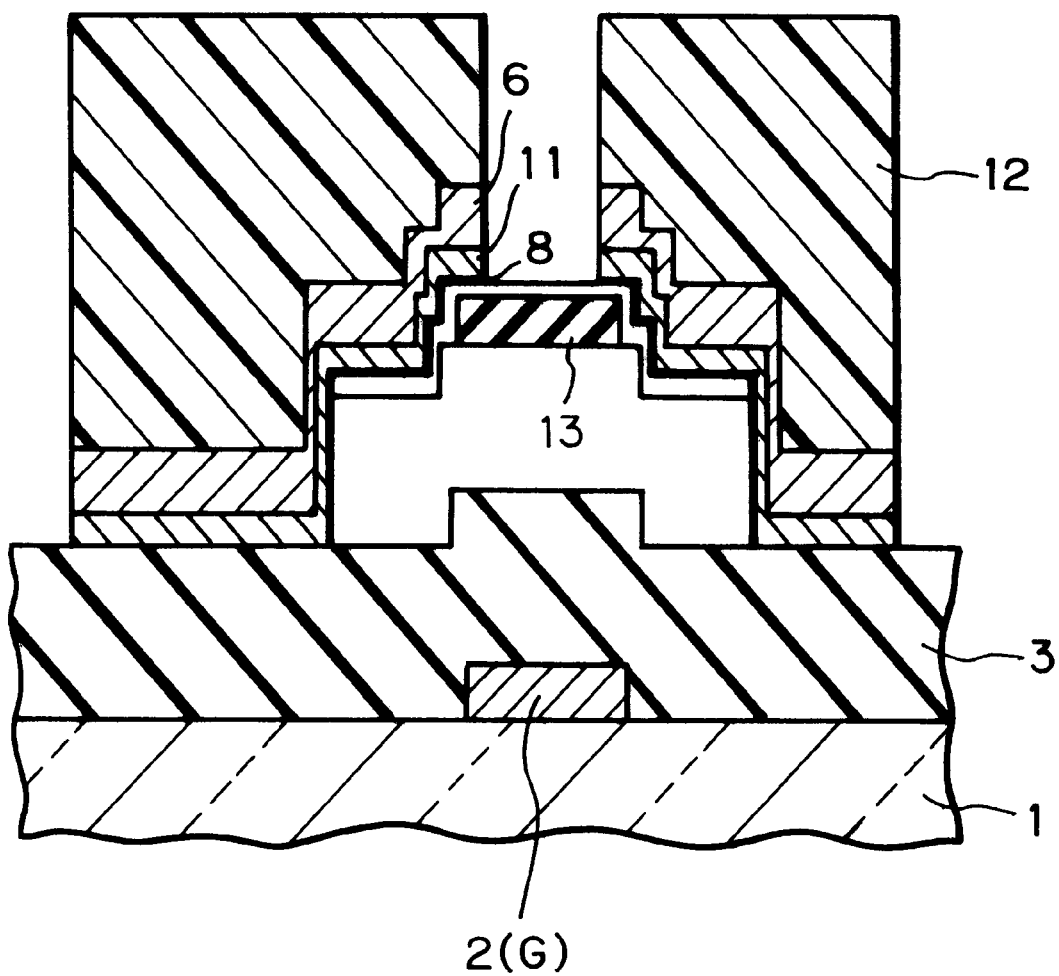
Figure 16D:
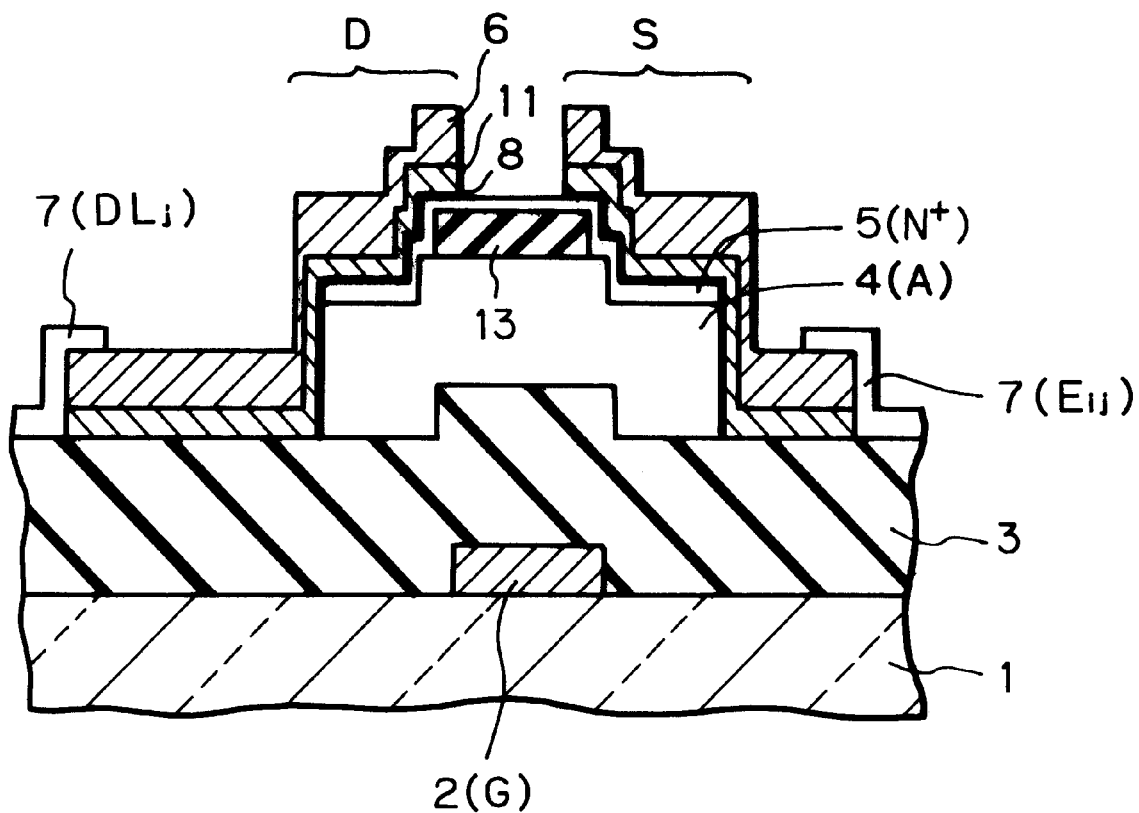

For example, the manufacturing steps of the apparatus of FIG. 14 are shown in FIGS. 16A, 16B, 16C and 16D, respectively, which correspond to FIGS. 10A, 10B, 10C and 10D, respectively. That is, as shown in FIG. 16D, the $N^+$-type amorphous silicon layer 5 is formed on the etching protection layer 13. Therefore, when a dry etching process is performed upon the $N^+$-type amorphous silicon layer 5, a part of the $N^+$-type amorphous silicon layer 5 above the etching protection layer 13 is completely etched; however, the amorphous silicon layer 4 is not etched due to the presence of the etching protection layer 13. In this case, note that a part of the protection layer 13 is etched.

In the above-described first embodiment, the conductive layer 6 can be made of other refractory metal such as Ta, Mo, Cr, Ti, Nb, MoTa, NbTa, WTa or WMo. In this case, this metal is the same as the metal of its underlying metal silicide layer, to carry out a sequential dry etching process. Also, in the above-mentioned second embodiment, the double conductive layer (6-1, 6-2) can be made of other metal such as Ta/W, Ta/Mo, Ta/Cr, Ta/Nb, Ta/V, Ta/NbTa, Ta/NbN or MoTa/Mo. In this case, the metal of the lower conductive layer 6-1 is the same as the metal of its lower metal silicide layer, to carry out a sequential dry etching process.

Further, the above-mentioned conductive layer can be made of non-refractory metal/refractory metal such as Al (or it alloy)/Cr, Al (or its alloy)/Ti, Al (or its alloy)/Mo, Al (or it alloy)/W, Al (or its alloy)/TiW, Al (or its alloy)/TiN or Cu/Ta. In addition, the conductive layer can be made of a triple configuration such as Al (or its alloy)/TiN/Ti or Ta/Cu/Ta.

As explained hereinbefore, according to the present invention, since the overetching amount of the amorphous silicon layers during a drain/source electrode forming step can be accurately controlled, the characteristics of the TFT can be improved, to reduce the display distortion. In addition, since the signal bus line includes metal silicide, the signal bus line is not susceptible to disconnection and electromigration.

I claim:

1. A method for manufacturing a liquid crystal display apparatus, comprising the steps of:

forming a gate electrode on an insulating substrate;

forming a gate insulating layer on said gate electrode;

forming a semiconductor active layer on said gate insulating layer;

forming a metal silicide layer on said semiconductor active layer by using a sputtering process;

forming a metal layer on said metal silicide layer;

etching said metal layer by a first dry etching process using a mask;

etching said metal silicide layer by a wet etching process using said mask, after said first dry etching process is carried out;

etching said semiconductor active layer using said metal layer as a mask, after said wet etching process is carried out.

2. The method as set forth in claim 1, wherein said semiconductor active layer etching step carries out a second dry etching process.

3. The method as set forth in claim 1, wherein said metal silicide layer and said metal layer form drain and source electrodes of a thin film transistor and a signal bus line connected to said drain electrode.

4. The method as set forth in claim 1, wherein said metal layer is made of refractory metal, and said metal silicide layer is made of silicide of said refractory metal.

5. The method as set forth in claim 1, wherein said metal layer is made of a double configuration of different kinds of refractory metal.

6. The method as set forth in claim 1, wherein said metal layer is made of a double configuration of refractory metal and non-refractory metal.

7. The method as set forth in claim 1, wherein said semiconductor active layer is made of non-doped amorphous silicon and impurity-doped amorphous silicon.

8. A method for manufacturing a liquid crystal display apparatus, comprising the steps of:

forming a gate electrode on an insulating substrate;

forming a gate insulating layer on said gate electrode;

forming a non-doped semiconductor active layer on said gate insulating layer;

forming an etching production layer on said non-doped semiconductor active layer;

forming an impurity-doped semiconductor active layer on said etching protection layer;

forming a metal silicide layer on said impurity-doped semiconductor active layer by using a sputtering process;

forming a metal layer on said metal silicide layer;

etching said metal layer by a first dry etching process using a mask;

etching said metal silicide layer by a wet etching process using said mask, after said first dry etching process is carried out;

etching said non-doped semiconductor active layer using said metal layer as a mask, after said wet etching process is carried out.

9. The method as set forth in claim 8, wherein said impurity-doped semiconductor active layer etching step carries out a second dry etching process.

10. The method as set forth in claim 8, wherein said metal silicide layer and said metal layer form drain and source electrodes of a thin film transistor and a signal bus line connected to said drain electrode.

11. The method as set forth in claim 8, wherein said metal layer is made of refractory metal, and said metal silicide layer is made of silicide of said refractory metal.

12. The method as set forth in claim 8, wherein said metal layer is made of a double configuration of different kinds of refractory metal.

13. The method as set forth in claim 8, wherein said metal layer is made of a double configuration of refractory metal and non-refractory metal.

14. The method as set forth in claim 8, wherein said non-doped semiconductor active layer is made of amorphous silicon, and said impurity-doped semiconductor active layer is made of impurity-doped amorphous silicon.

* * * * *